United States Patent
Arrington et al.

(10) Patent No.: US 11,842,944 B2
(45) Date of Patent: Dec. 12, 2023

(54) IC ASSEMBLIES INCLUDING DIE PERIMETER FRAMES SUITABLE FOR CONTAINING THERMAL INTERFACE MATERIALS

(71) Applicant: Intel Corporation, Santa Clara, CA (US)

(72) Inventors: Kyle Arrington, Gilbert, AZ (US); Frederick Atadana, Chandler, AZ (US); Taylor Gaines, Chandler, AZ (US); Minseok Ha, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 837 days.

(21) Appl. No.: 16/727,770

(22) Filed: Dec. 26, 2019

(65) Prior Publication Data
US 2021/0202348 A1    Jul. 1, 2021

(51) Int. Cl.
| | |
|---|---|
| *H01L 23/373* | (2006.01) |
| *H01L 23/367* | (2006.01) |
| *H01L 21/48* | (2006.01) |

(52) U.S. Cl.
CPC ........ *H01L 23/373* (2013.01); *H01L 21/4882* (2013.01); *H01L 23/3675* (2013.01)

(58) Field of Classification Search
CPC .......................... H01L 23/373; H01L 23/3675
See application file for complete search history.

(56) References Cited

U.S. PATENT DOCUMENTS

| | | | | |
|---|---|---|---|---|
| 5,460,767 | A * | 10/1995 | Sanftleben | C09D 5/008 29/841 |
| 2003/0085475 | A1* | 5/2003 | Im | H01L 23/16 257/796 |
| 2011/0037082 | A1* | 2/2011 | Doan | H05B 45/30 257/E33.056 |
| 2011/0049702 | A1* | 3/2011 | Negoro | H01L 21/50 257/E23.101 |
| 2013/0011617 | A1* | 1/2013 | Tasaki | H01L 31/035281 174/250 |
| 2017/0188448 | A1* | 6/2017 | Liang | H05K 7/2039 |
| 2020/0328185 | A1* | 10/2020 | Tsai | H01L 23/481 |

OTHER PUBLICATIONS

EP 1521304; Process for Producing Resin-Sealed Type Electronic Device; Sugino et al.; published Jun. 4, 2005.*

\* cited by examiner

*Primary Examiner* — Peniel M Gumedzoe
(74) *Attorney, Agent, or Firm* — Essential Patents Group, LLP

(57) ABSTRACT

An integrated circuit (IC) assembly comprising an IC die and a frame material that has been dispensed over the assembly substrate to be further adjacent to a perimeter edge of the IC die. The frame material may be selected to have flow properties that minimize slump, for example so a profile of a transverse cross-section through the frame material may retain convex curvature. The frame material may be cured following dispense, and upon application of a thermal interface material (TIM), the frame material may and act as a barrier, impeding flow of the TIM. The frame material may be compressed by force applied through an external thermal solution, such as a heat sink, to ensure good contact to the TIM.

22 Claims, 11 Drawing Sheets

IC ASSEMBLIES INCLUDING DIE PERIMETER FRAMES SUITABLE FOR CONTAINING THERMAL INTERFACE MATERIALS

BACKGROUND

As computing devices continue to get smaller and more powerful, thermal management presents new challenges. System-level thermal solutions, such as heat sinks, are commonly coupled with integrated circuit (IC) die through the use of a thermal interface material, to transport heat generated by the IC die, and to dissipate that heat to the external environment. Thermal interface materials can be semi-solid or liquid, such as greases or polymers, for example. If thermal interface materials are allowed to migrate away from the surface of an IC die, thermal performance could decline significantly. For example, hot-spots may develop, which can significantly shorten the life of a computing device. Thermal interface material that bleeds away from an IC can also potentially migrate past a designed "keep-out" zone, and contact adjacent components, risking other component failures.

FIG. 1 illustrates one example of a conventional IC assembly 101 that may be incorporated in an electronic device, such as a laptop computer, smartphone, etc. In FIG. 1, a heat sink 103 that is to dissipate heat from IC assembly 101 is illustrated as having been lifted from the surface of IC assembly 101, revealing an underlying IC die 105. IC die 105 is attached to an assembly substrate 110. Assembly substrate 110 may be further attached to a host circuit board (not depicted). IC assembly 101 further includes a thermal interface pad preform 115, which may be affixed to assembly substrate 110, for example with an adhesive on the back side of the pad. Once pad preform 115 has been stamped out of some sheet good according to a predetermined stencil, it may be peeled from the sheet good backing, and pressed onto assembly substrate 110 according to a simple "peel-and-stick" technique. Thermal interface pad preform 115 has significant thickness, for example, 1 mm, or more.

Within the inner area defined by thermal interface pad preform 115, another thermal interface material 115 may be applied. The thickness of thermal interface pad preform 115 may act to define a well in which thermal interface material 115 may then be contained. Thermal interface material 115 may therefore be some material with superior thermal conductivity that might otherwise be susceptible to bleeding-out from between IC die 105 and heat sink 103. Heat sink 103 may be affixed by some means so as to be in contact both with thermal interface material 115 and thermal interface pad preform 115.

While the architecture illustrated in FIG. 1 may be useful for some applications, thermal interface pad preform 115 has a prohibitively large footprint for applications where assembly area is a premium. The large keep-out zone needed to accommodate pad preform 115 is not readily scalable as the difficulty of applying such a preform increases significantly as dimensions are reduced, and/or placement positional accuracy is increased. Therefore, there is a need for an IC assembly architecture that is compatible with small keep out zones and can provide a barrier against bleed-out of thermal interface material.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
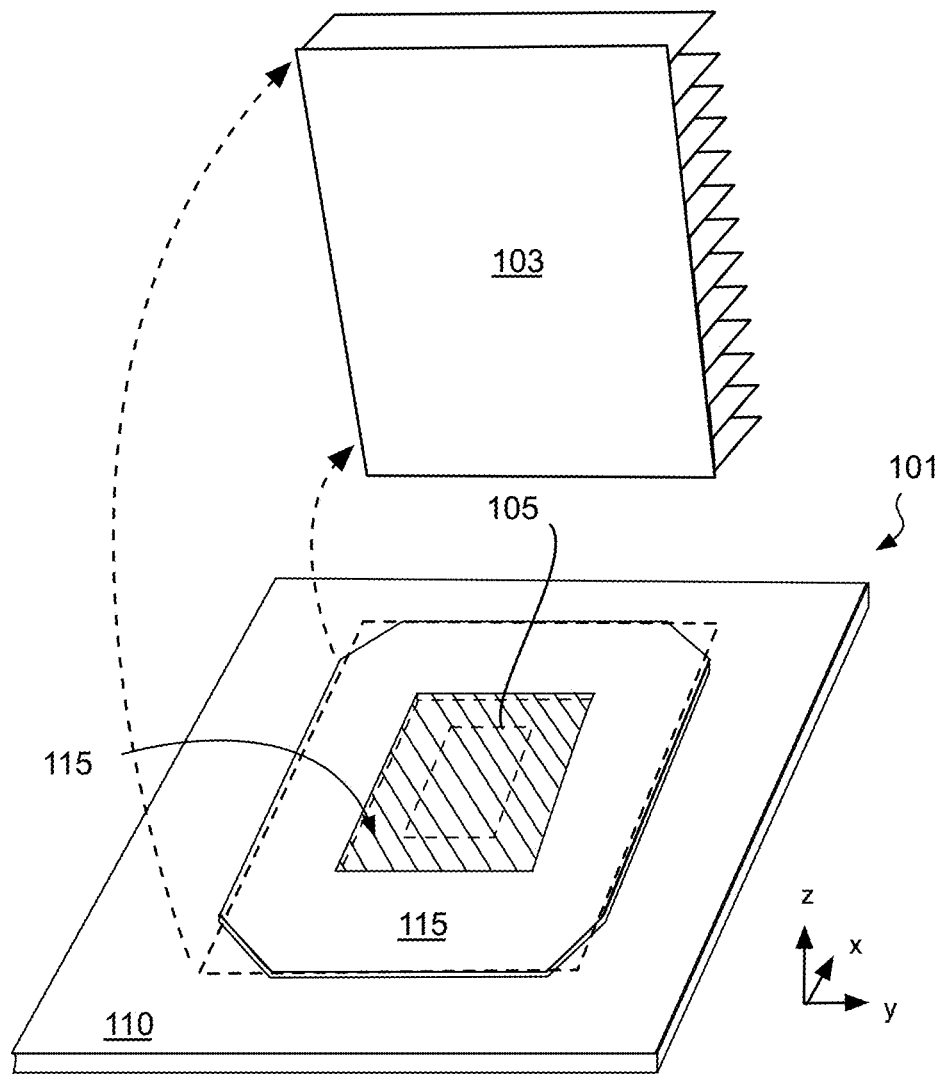
FIG. 1 illustrates an isometric view of a conventional IC assembly employing a pad preform and a thermal interface material, according to some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, a frame material may be dispensed upon an integrated circuit (IC) assembly so as to be adjacent to a perimeter edge of an IC die. The frame material may be selected to have flow properties during the dispense that minimize slump. For example, the frame material may have a relative high thixotropic index and/or viscosity. The frame material may be selected to have a suitable hardness and/or storage modulus following dispense and/or a post-dispense cure. The frame material may protrude a height over the assembly substrate beyond that of the IC die so as to present a barrier suitable for impeding flow of a thermal interface material (TIM) subsequently applied to a surface of the IC die. The frame material may therefore define a TIM "keep-in" zone. The frame material may be subsequently compressed by a force applied through a heat sink (or other heat exchanger) to ensure good contact to the TIM. The frame material may prevent bleed-out, or other unwanted expansion, of the TIM. In accordance with embodiments, a TIM barrier can be added during a first-level assembly process (e.g., by supplementing an IC die underfill process) at minimal additional cost and/or without significantly increasing a keep-out zone area. With the frame material in place, any suitable TIM applied during a subsequent level of component assembly can be better controlled to ensure sufficient thermal conduction to any suitable thermal solution that is applied over the TIM. Embodiments herein may therefore enable more reliable IC assembly with better thermal performance, and smaller footprints.

Figure 2:
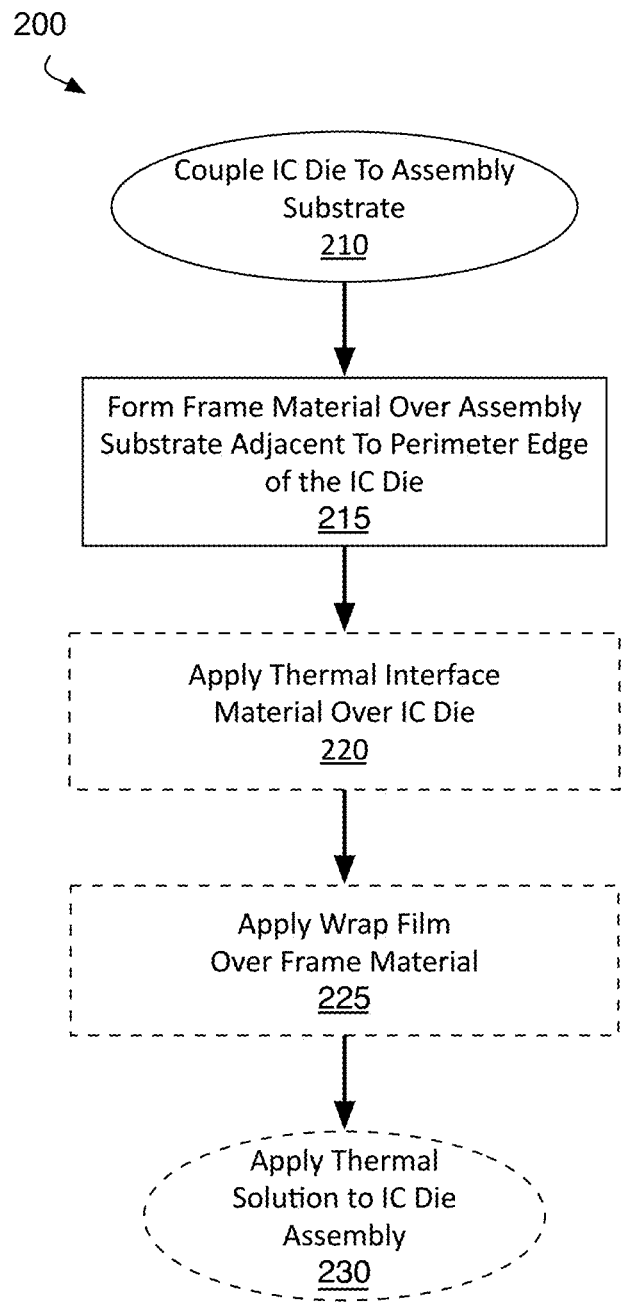
FIG. 2 illustrates a flow diagram of methods of forming an IC assembly including a frame material suitable for containing thermal interface materials, in accordance with some embodiments.

FIG. 2 illustrates a flow diagram of methods 200 for forming an integrated circuit device assembly including a die perimeter frame material suitable for containing a thermal interface material, in accordance with some embodiments. FIG. 3-9 illustrate an IC assembly evolving as the methods of FIG. 2 are practiced, in accordance with some embodiments of methods 200. For clarity of description, FIG. 2 is described in conjunction with FIG. 3-9, which provide illustrative examples of some advantageous embodiments of methods 200. However, not all embodiments of methods 200 require all the features exemplified in FIG. 3-9. Similarly, the practice of methods 200 is not necessarily required to arrive at one or more of the features exemplified in FIG. 3-9.

Referring first to FIG. 2, methods 200 begin at block 210 where one or more IC die are coupled (physically and/or electrically) to an assembly substrate. Block 210 may be performed as a first level of integrating an IC die into an assembly that may be further integrated into an electronic system. Although not limited in this context, block 210 may be performed by an IC die fabrication facility in preparation for the sale of a minimally packaged IC die product, for example. Alternatively, methods 200 may begin with receiving, as an input, an IC assembly that includes an IC die coupled to an assembly substrate. Hence, methods 200 may include the first-level assembling, or first-level assembling may have been performed upstream of methods 200.

Figure 3:
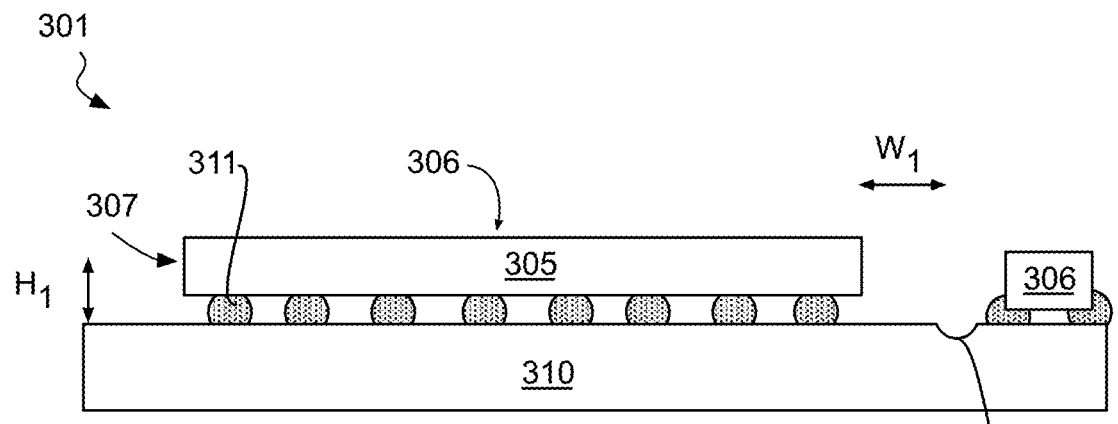
FIGS. 3, 4, 5A, 5B, 5C, 5D, 6, 7, 8 and 9 illustrate an IC assembly evolving as the methods of FIG. 2 are practiced, in accordance with some embodiments.
Figure 4:
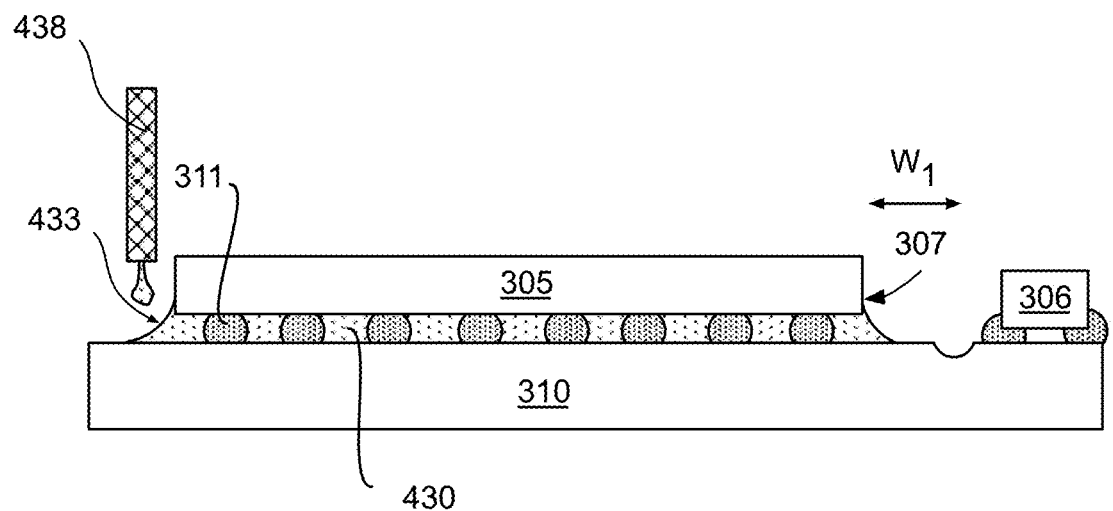

In the example further illustrated in the cross-sectional view of FIG. 3, an IC assembly 301 includes an IC die 305 attached to an assembly substrate 310. Although only one IC die 305 is illustrated, two or more such IC die may be similarly attached to assembly substrate 310, for example in multi-chip package embodiments. IC die 305 may be any type of IC die including, but not limited to, a microprocessor, a controller, a field programmable gate array (FPGA), an application specific IC (ASIC), a system-on-chip (SOC), an electronic memory chip (e.g., DRAM, flash memory, etc.), a graphics processor, an artificial intelligence (AI) accelerator, etc. Assembly substrate 310 may be any suitable substrate to which an IC die may be attached, either through first level interconnects (FLI), or through direct (e.g., hybrid) bonding, for example. Assembly substrate 310 may therefore be another IC die, a passive or active interposer (glass or semiconductor), a package substrate, a mold material (with or without fan-out build-up metallization layers embedded therein), or the like.

In the example shown FIG. 3, IC die 305 is attached to assembly substrate 310 by a FLI 311. FLI 311 may be microbumps, for example, which may include a solder joint, but need not. Other FLI technologies may be used in alternative embodiments, or as noted above, there may be a direct bond between IC die 305 and assembly substrate 310. For example, where assembly substrate 310 is a first (larger) IC die 305, IC die 305 may be directly bonded to assembly substrate 310 IC die 305 has a perimeter edge (or sidewall) 307, and a surface 306 that is opposite assembly substrate 310. In the exemplary embodiment where IC die 305 is flip-chip attached, surface 306 is a back-side of IC die 305. In some embodiments, surface 306 is a bare semiconductor surface (e.g., monocrystalline silicon). In other embodiments, there is a back-side side metallization as surface 306.

Although IC die 305 may occupy any footprint (area), assembly substrate 310 has a larger footprint or area than that of IC die 305, As further illustrated, assembly substrate 310 may include one or more die-side components 306, such as, but not limited to, IC devices, sensors, capacitors or other passive devices, etc., which may be electrically coupled with IC die 305 through electrical routing embedded within assembly substrate 310 (not depicted). In some embodiments, die-side components 306 are positioned within 1 cm of IC die 305. Between IC die 305 and die-side components 306 there may be a recessed substrate channel 313 delineating a keep-out zone where packaging material associated with IC die 305 is to be contained, for example to avoid detrimentally impacting die-side components 306. Substrate channel 313 may be spaced apart from IC die perimeter edge 307 by a lateral width $W_1$ of 3-9 mm, for example.

Depending on how IC die 305 is coupled to assembly substrate 310, attachment may further comprise application of one or more adhesives or sealants. In the example further illustrated in FIG. 4, an underfill material 430 may be applied, along IC die perimeter edge 307, for example with a needle jet dispenser 438. Other packaging architectures are also possible. For example, a die attach film (DAF) may be applied between substrate 310 and IC die 305. For the illustrated example, underfill material 430 may have any composition known to be suitable as IC chip underfill. Underfill material 430 may, for example, comprise an epoxy resin with a filler, such as fumed silica. The epoxy resin and filler may be selected to achieve a good coefficient of thermal expansion (CTE) match with FLI 311 and/or IC die 305. Underfill material 430 will typically have a sufficiently low viscosity so as to flow under IC die 305, for example through capillary action. Following dispense, underfill material 430 may be cured (e.g., thermally) to achieve desired thermomechanical properties and/or eliminate void defects in underfill material 430. Following underfill dispense and/or underfill cure, there is an underfill fillet 433 over a portion of assembly substrate 310 beyond IC die perimeter edge 307. As illustrated, underfill fillet 433 has advantageously concave surface curvature. Underfill fillet 433 spreads laterally beyond IC die perimeter edge 307 by less than lateral width and in some examples spreads laterally beyond IC die perimeter edge by no more than 1-2 mm.

Returning to FIG. 2, methods 200 continue at block 215 where a frame material is dispensed over the assembly substrate, adjacent to the perimeter edge(s) of the one or more IC die. The term "frame" is employed herein merely as a label descriptive of location of material relative to the IC die. In other words, the "frame material" is to "frame" at least a majority of the perimeter edge of one or more IC dies in an IC assembly. In exemplary embodiments, the frame material is not dispensed onto the IC die itself, but rather over the assembly substrate (which is larger than the IC die), as close to the IC die edge as practicable. The fame material may be dispensed by any means suitable for extruding a bead of material having the physical properties of the frame material. In some examples, the frame material is dispensed with an auger at high shear rate as the frame material (as-dispensed) advantageously has a high thixotropic index, which will enable the dispense to precisely control the physical height of the frame material, as well as lateral spread and/or migration of the frame material. The dispense technique(s) employed may advantageously allow for tuning of the frame material's height and lateral spread, for example through control of a dispense gap and dispense rate (weight and/or speed).

Figure 5A:
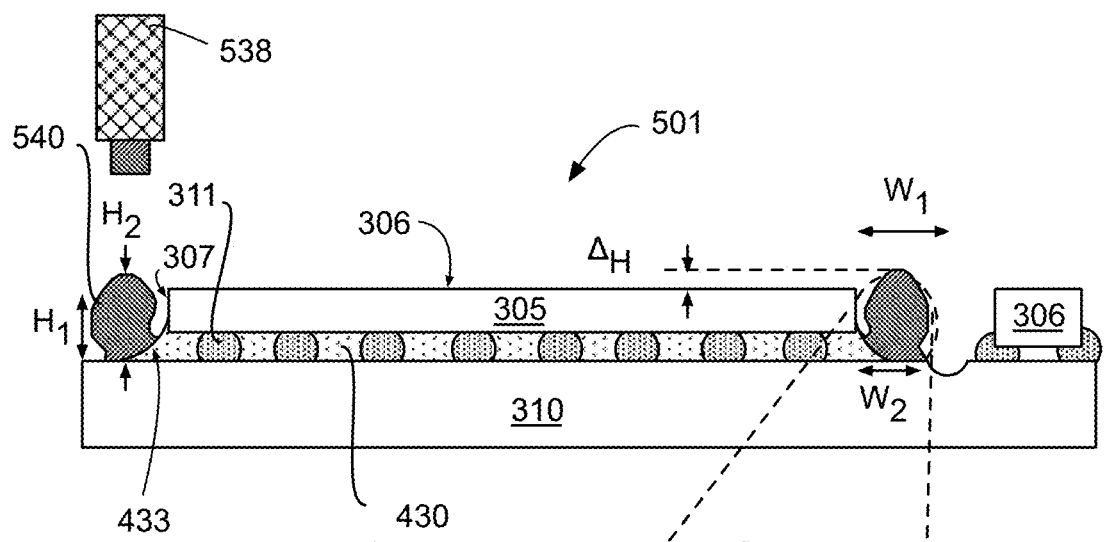

For the exemplary IC assembly 501 further illustrated in FIG. 5A, a dispenser 538 applies a bead of frame material 540 adjacent to IC die perimeter edge 307. The cross-sectional plane shown in FIG. 5A depicts a transverse cross-section of frame material 540. In this example, where the IC assembly includes underfill 430, at least a portion of frame material 540 is over at least a portion of underfill fillet 433, in the example illustrated, a portion of frame material 540 is in direct contact with a portion of underfill fillet 433, and a portion of frame material 540 is in direct contact with assembly substrate 310. Frame material 540 may also be exclusively on underfill fillet 433. Alternatively, frame material 540 may be exclusively in contact with assembly substrate 310 (either because there is no underfill fillet 433, or because frame material 540 is applied at a location laterally spaced from underfill fillet 433). Although frame material 540 is illustrated as being spaced apart from IC die perimeter edge 307, it may also be in contact with IC die perimeter edge 307. For embodiments including underfill fillet 433, the application of frame material 540 may amount to a second pass process that supplements the application of underfill material. As the dispense control and materials applied may have similarities, frame material dispense may be best performed by those skilled in the art of dispensing underfill materials.

As further shown in FIG. 5A, upper IC die surface 306 is at a height $H_1$ over assembly substrate 310. Height $H_1$ may vary as a function of the FLI architecture. Frame material 540 is applied to a height $H_2$, which is greater than height $H_1$ by an amount $\Delta H$. Although $\Delta H$ may vary, in some embodiments $\Delta H$ is at least equal to a target bond line thickness (BLT) for a thermal interface material that is to be subsequently applied to IC die surface 306. At the height $H_2$, frame material 540 will be able to function as a barrier against flow of the TIM applied to IC die surface 306. In some advantageous embodiments, $\Delta H$ is some predetermined threshold amount greater than the target BLT for the TIM that is to be subsequently applied to IC die surface 306. The $\Delta H$ selected may further depend on properties of frame material 540, such as a final hardness, and/or compression %, and/or storage modulus. A frame material 540 that is more elastic has the advantage of being able to compress to a wider range of TIM bond line thicknesses. In some exemplary, embodiments, $\Delta H$ is less than 250 µm, advantageously less than 100 µm, and may be less than 75 µm (e.g., where the TIM to be applied has a BLT of approximately 50 µm). Such small $\Delta H$ highlights one advantage of frame material 540 over a material preform, which might need a thickness of many hundreds of microns for the sake of preform integrity. It should be noted that for multi-chip embodiments where there are multiple IC die, $\Delta H$ may be different between IC die of different thicknesses.

In some embodiments, frame material 540 is applied to a maximum lateral width (e.g., y-dimension) $W_2$ that is less than lateral width $W_1$. Lateral width $W_2$ is measured from IC die sidewall 307, and therefore is a function of both the lateral spread of frame material 540 and any spacing between sidewall 307 and frame material 540. In exemplary embodiments, lateral width $W_2$ is less than 5 mm, more advantageously less than 2 mm, and may even be less than 500 µm. Such small lateral widths $W_1$ highlight a scaling advantage of frame material 540 relative to a material preform, which might need to occupy a centimeter or more of lateral width (for the sake of preform integrity, or otherwise). Additionally, a large preform may also need a greater margin of error in lateral positioning relative to IC die perimeter edge 307.

For frame material 540, lateral width $W_2$ and height $H_2$ may both be tightly controlled, through dimensions and properties of frame material 540 as-applied. Lateral spread may be controlled by limiting slump of frame material 540, for example by controlling the temperature of assembly substrate 310 (e.g., providing a no-heat environment) and thixotropic properties of frame material 540. In some exemplary embodiments shown in the expanded view further depicted in FIG. 5A, slump may be controlled so that at least some portion of the transverse cross-sectional profile of frame material 540 has convex surface curvature. Convex surface curvature of frame material 540 may arise as a result of a finite amount slump. Such convex curvature is indicative of a direct (e.g., bead) dispense of a high-viscosity/high-thixotropic material, and is in contrast to the concave curvature of underfill fillet 433. Convex curvature is also in contrast to a material preform profile, which is typically linear as a result of a through-sheet stamping process. Frame material 540 may also have its own fillet as visual indication of material wetting to the surface, which would likely be visible from a top down view as well as the cross sectional view shown in FIG. 5A. Such a fillet typically has a concave surface curvature, which would also be absent from the profile of a material preform.

In the transverse cross-sectional profile shown in the expanded view of FIG. 5A, frame material 540 has a convex sidewall surface 533A. Frame material 540 also has a trailing concave side wall fillet surface 533B as well as an advancing concave sidewall fillet surface 533C, for example. Depending on the relative position of frame material 540 and underfill fillet 433, sidewall fillets surfaces 533B and 553C may be symmetrical or asymmetrical (e.g., with fillet surface 533B being larger as a trailing edge). These profile features, along with the material dimensions and/or proximity to IC die perimeter edge 307 may be retained following subsequent processing (e.g., cures, reflows, externally applied stress).

Material properties of frame material 540 need not be constrained in the same manner as underfill material. For example, CTE of frame material 540 is of less importance. Thermal conductivity of frame material 540 may also be of little concern. As-dispensed viscosity of frame material 540 should be considerably higher than that of underfill material 430, and therefore can be expected to have different composition than underfill material 430. In some exemplary embodiments, the viscosity of frame material 540 (as-dispensed) is in the range of 10,000-200,000 centipoise. As noted above, a high thixotropic index (e.g. >3) ensures a low-slump profile is maintained throughout dispense and subsequent thermal processing (e.g., cure).

As noted above, frame material 540 is advantageously compressible and possesses significant rebound. The storage modulus of frame material 540 is advantageously low enough that little stress is transferred to an underlying underfill fillet 430 and/or assembly substrate 310 so as to not damage the underlying material(s). In some embodiments, frame material 540 has a storage modulus under 100 MPa and advantageously under 10 MPa. These modulus values are ideally maintained over a temperature range of −55-125° C. In some exemplary embodiments, frame material 540 has a hardness no more than 100 on the Shore A hardness scale. In some advantageous embodiments, frame material 540 has a hardness between the lowest value on the Shore 00 scale and 75 on the Shore A scale. In some specific embodiments, frame material 540 has a hardness between 20 and 60 on the Shore A scale. With such hardness values, frame material 540 may display compression in the range of 10-50%. This level of compliance will ensure frame material 540 will strain under the application of something less than 20 PSI. Frame material 540 may also have some adhesive properties, for example to retain a bond with assembly substrate 310.

In some embodiments, frame material 540 is a polymer. Exemplary polymers include polysiloxanes (silicone), polyurethanes, low $T_g$ epoxies, polyactylates, and thermoplastic elastomers. Many other materials (polymers, or otherwise) may also be suitable as frame material 540. Fillers (e.g., fumed silica, titanium oxide, zinc oxide, alumina, alumina nitride, or one or more other thixo agents) may be added to the material system (polymer, or otherwise) to yield a material of sufficiently high thixotropic index, in some further embodiments, frame material 540 is a closed cell foam, as such foams may be readily tuned to have a desired hardness.

Frame material 540 may be cured following dispense. Any cure process known to be suitable for the composition of fame material 540 may be practiced as embodiments are not limited in this context. A thermal cure (e.g., laser anneal) or UV cure are just a few examples. Although an anneal may not be necessary depending on the material composition, a cure may facilitate dispense of frame material 540, and stabilize frame material 540 against further modification during subsequent assembly processes (e.g., solder reflows, etc.). Height $H_2$ and lateral width $W_2$, profile curvature, contact angle, hardness, and compression/elongation, as noted above, may all be achieved by (or maintained through) any cure process. For embodiments where frame material is 100% solids, dimensional changes should be minimal, but if the cure process induces dimensional and/or material property changes, the dispense may be designed to accommodate such changes.

Figure 5B:
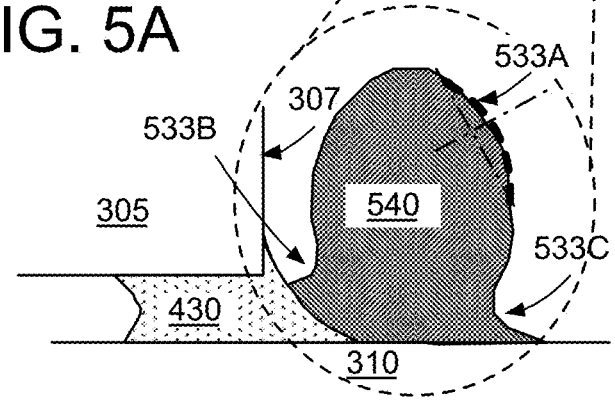
Figure 5B:
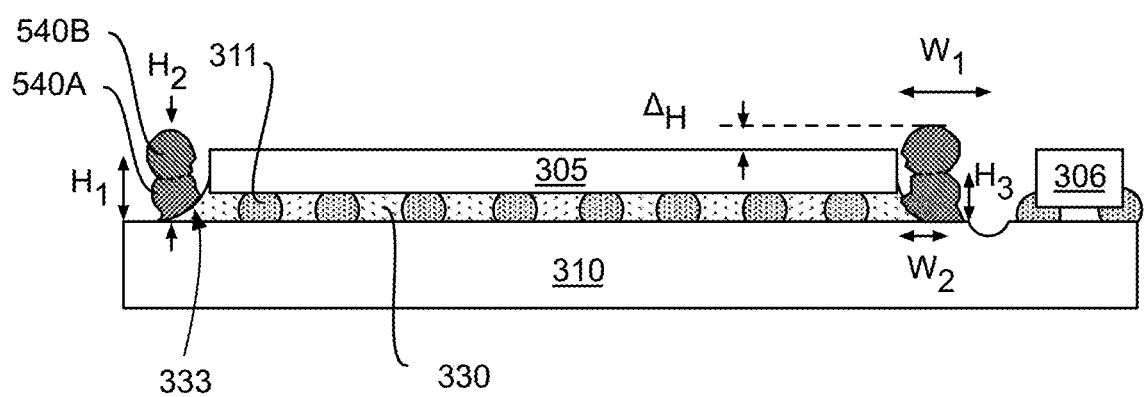
Figure 5C:
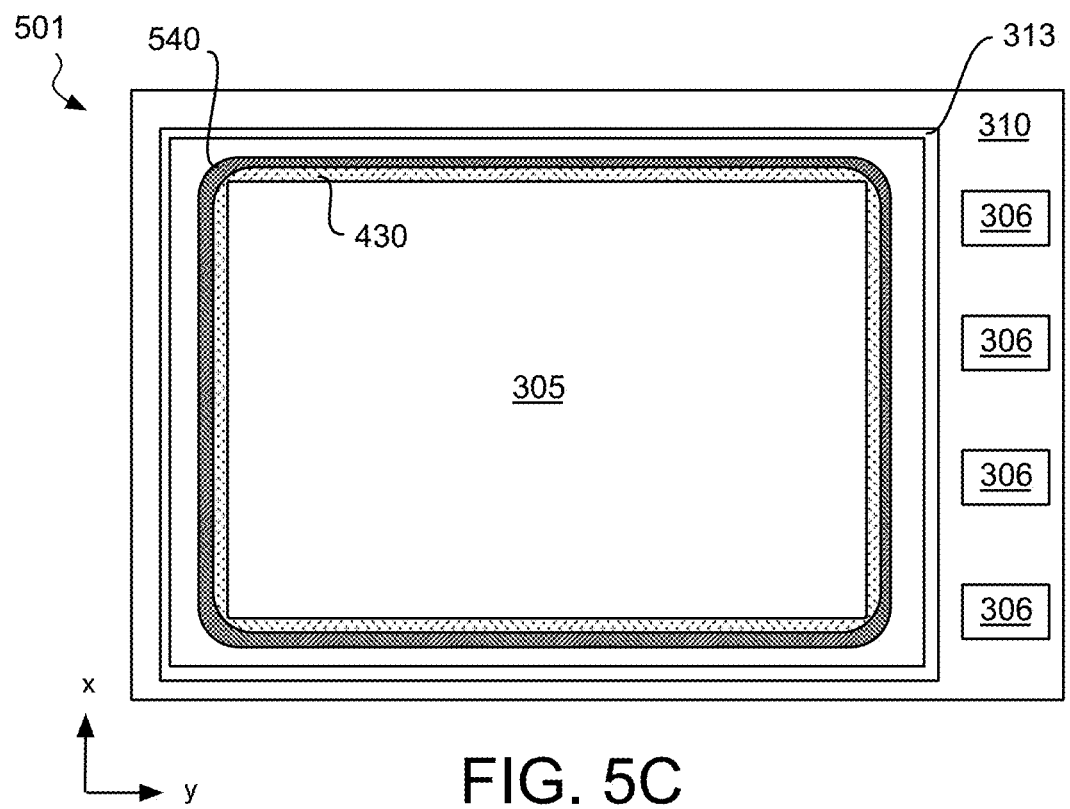

In some embodiments, multiple dispense passes are employed to achieve a frame material of a sufficient height $H_2$. Multi-pass dispense embodiments may increase the aspect ratio ($H_2$:$W_2$) of a frame material. FIG. 5B further illustrates one example where a frame material 540A has been applied with a first-pass dispense, and a second-pass has dispensed a frame material 540B onto frame material 540A. As shown, both frame material 540A and frame material 540B have a transverse cross-sectional profile with convex curvature. Although frame material 540A and 540B are illustrated with approximately equal transverse diameters, the diameter of one may vary relative to the other. For example 540A may have a larger diameter than 540B. Regardless, a distinct "snow-man" profile may be evident. For multi-pass embodiments, a cure may be performed after dispense of frame material 540A, and prior to dispense of frame material 540B, or a single cure of both frame materials 540A and 540B may be performed.

Figure 5D:
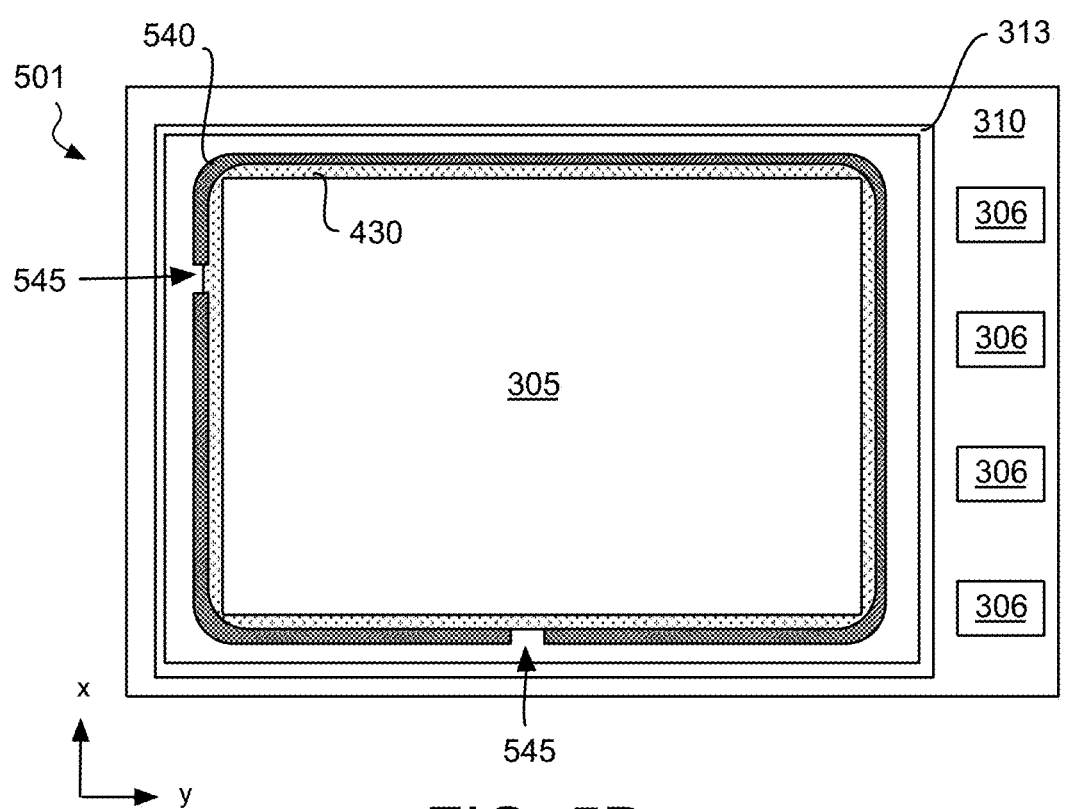
Figure 6:
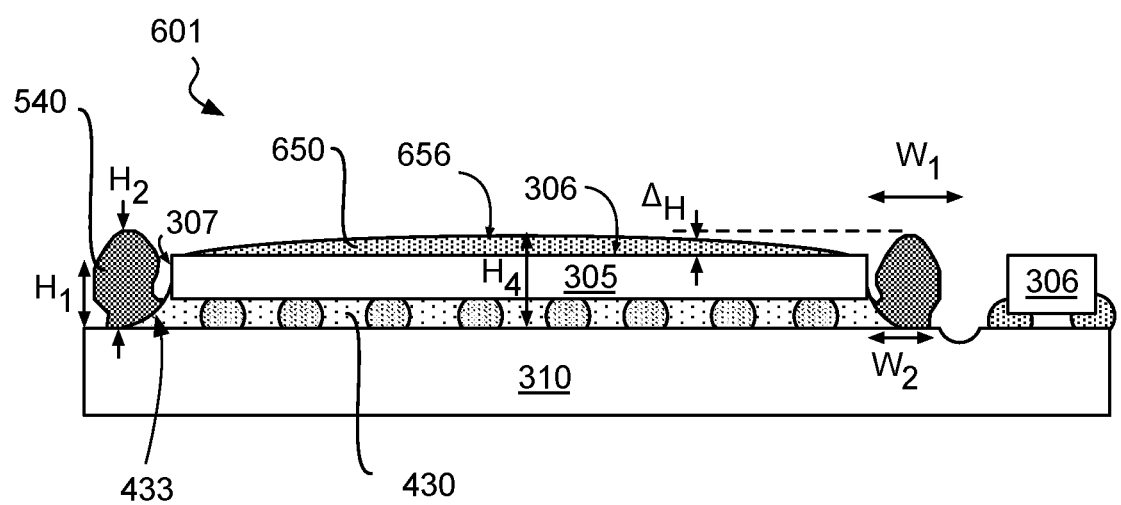

Frame material 540 is to be adjacent to at least a majority of IC die perimeter edge 307. As further illustrated in the plan view of FIG. 5C, frame material 540 fully encloses IC die 305 (or all IC die of a multi-chip package). For some multi-chip embodiments, frame material 540 may also surround individual ones of the IC die (e.g., with frame material 540 extending between adjacent edges of two adjacent IC die). Although frame material 540 is shown as having a relatively constant bead width, frame material 540 may instead vary in width along its longitudinal length. One or more gaps or recesses in frame material 540 may be introduced, for example to allow for venting/outgassing of the IC assembly. For example, an IC assembly 502 illustrated in the plan view of FIG. 5D has gaps or openings 545 that bifurcate frame material 540 into two or more frame segments. Gap dimensions may be predetermined to allow for fluid (gas) venting without compromising the ability for frame material 540 to function as a TIM flow barrier. In some examples, gaps 545 range from between 100 μm and 1000 μm in width (x or y axis). FIG. 5D illustrates an example where frame material 540 is completely absent within gaps 545. However, in alternative embodiments, frame material height $H_2$ may instead be reduced to some non-zero value within gaps 545.

Returning to FIG. 2 with the frame material applied (and cured), methods 200 continue at block 220. Block 220 and all remaining blocks in methods 200 are illustrated in dashed line to emphasize that these blocks may be optionally practiced. For example, methods 200 may be substantially complete following formation of the frame material. An IC assembly including such a frame material may be commercially sold at that point, for example as a bare die assembly that will be further assembled by a customer as a component in a computing device. Such a customer may, for example, practice one or more of the remaining blocks of methods 200.

At block 220, a thermal interface material is applied over the IC die. Any thermal interface material known to be suitable for transferring heat between an IC die and an external thermal solution may be applied to block 220. Any technique known to be suitable for applying thermal interface material to an IC die may be practiced at block 220. In the example illustrated in FIG. 6, an IC assembly 601 further includes a TIM 650. TIM 650 may have any composition having a sufficiently high thermal conductivity for the application. TIM 650 may be polymer, polymer composite (e.g., metallic or ceramic particles in silicone), phase change material (PCM), graphite composite, or carbon nanotubes in resin, for example. In other embodiments, TIM 650 is a low-inciting temperature metal or metal alloy, for example comprising gallium. The composition of TIM 650 can be selected based on thermal performance needed by assembly IC assembly 601. In some embodiments, TIM 650 has a thermal conductivity of greater than 4 watt per meter-kelvin (W/(mK)).

TIM 650 may be applied to upper IC die surface 306 at a temperature where TIM 650 is a fluid that may flow with TIM surface 656 then having convex (meniscus) curvature, as illustrated. TIM 650 is in direct contact with upper IC die surface 306. Although not depicted in FIG. 6, TIM 650 may also be in direct contact with an interior side of frame material 540. TIM 650 may, but need not, also till in any gap or space that is between IC die perimeter edge 307 and frame material 540. TIM 650 may have any thickness that ensures TIM surface 656 has a maximum height $H_4$ that is less than frame material height $H_2$. As such, TIM 650 may be completely contained within an outer perimeter defined by frame material 540. In the presence of frame material 540, the risk of bleed-out failures resulting in either a loss of assembly yield, or reliability failures in the field is significantly reduced.

Returning to FIG. 2 with TIM over the IC die, methods 200 may continue at block 225. Block 225 is again denoted in dashed line to emphasize that this block is optional. For example, methods 200 may be substantially complete following formation of the frame material and the application TIM over the exposed surface of the IC die. An IC assembly including such a frame material and a "pre-applied" TIM over the IC surface may be commercially sold at that point, for example as a die assembly that will achieve a specified thermal performance when further assembled by a customer as a component in an electronic device. Such a customer may, for example, practice one or more of the remaining blocks of methods 200.

Methods 200 may continue at block 225 where a wrap film is applied over a TIM material that has been applied to an IC die in an assembly further including a frame material. A wrap film may be applied by any techniques, such as, but not limited to, press-on/lamination processes. The wrap film may function as a dust barrier and/or otherwise protect a pre-applied TIM. The wrap film may be advantageously removable, for example to facilitate contacting a thermal solution to the TIM material. The wrap film applied at block 225 may have any composition suitable for such an application, and any process suitable for applying the chosen wrap film may be practice at block 225. In the example illustrated in FIG. 7, IC assembly 701 further includes wrap film 760, which is in contact with a least frame material 540. Wrap film 760 may be affixed to frame material 540 (exclusively, or nonexclusively), for example with any suitable adhesive. Wrap film 760 may be, for example, a polyethylene terephthalate (PET) film, or similar (DAF-type) material. Wrap film 760 may optionally include an adhesive, for example depending on the tack of frame material 540. Wrap film 760 may have any thickness, with 50-250 μm being one exemplary range. Wrap film 760 may make physical contact with TIM surface 656, or it may stand-off TIM surface 656, for example by some vertical distance approximately equal to the difference between heights 112 and 114.

Returning to FIG. 2 with the IC die optionally covered with TIM (and optionally a wrap film), methods 200 may complete at block 230. Block 230 is again denoted in dashed line to emphasize that this block is optional. For example, methods 200 may be substantially complete following formation of the frame material, or application TIM over the exposed surface of the IC die, or application of the wrap film over the frame material. An IC assembly including such a frame material, "pre-applied" Tim over the IC surface, and a wrap film over the pre-applied TIM may be commercially sold, for example as a die assembly that can achieve a specified thermal performance when further assembled by a customer as a component in an electronic device. Such a customer may, for example, practice block 230 of methods 200.

Methods 200 may continue at block 230 where a thermal solution is applied to an IC assembly that includes a frame material. The thermal solution may be any heat exchanger, such as a heat sink, cold plate, or heat pipe, etc. that is suitable for dissipating heat generated by an IC die. One or more assembly operations may precede application of a thermal solution. For example, an IC assembly may be further assembled at a system level of component integration before the thermal solution is applied. In the example further illustrated in FIG. 8, component assembly 801 includes IC assembly 601 (FIG. 6) coupled to a host component 810 through second level interconnects (2LI) 811. 2LI 811 interconnects input/output signals, power, ground, etc. to and from IC assembly 601. 2LI 811 may be solder features of a ball grid array (BGA), for example. Surface mount (e.g., solder paste LGA) or socket mount technologies may also be used in alternative embodiments. Host component 810 has a larger footprint than IC assembly 601, and 2LI 811 may have a significantly coarser interconnect feature pitch than FLI 311. Host component 810 may be any component known to be suitable as a host to an IC assembly, such as, but not limited to, a printed circuit board. Although not depicted, host component 810 may include one or more processors, controllers, sensors, memory devices, passive devices, etc., which may be coupled with IC die 305 through electrical routing.

Figure 7:
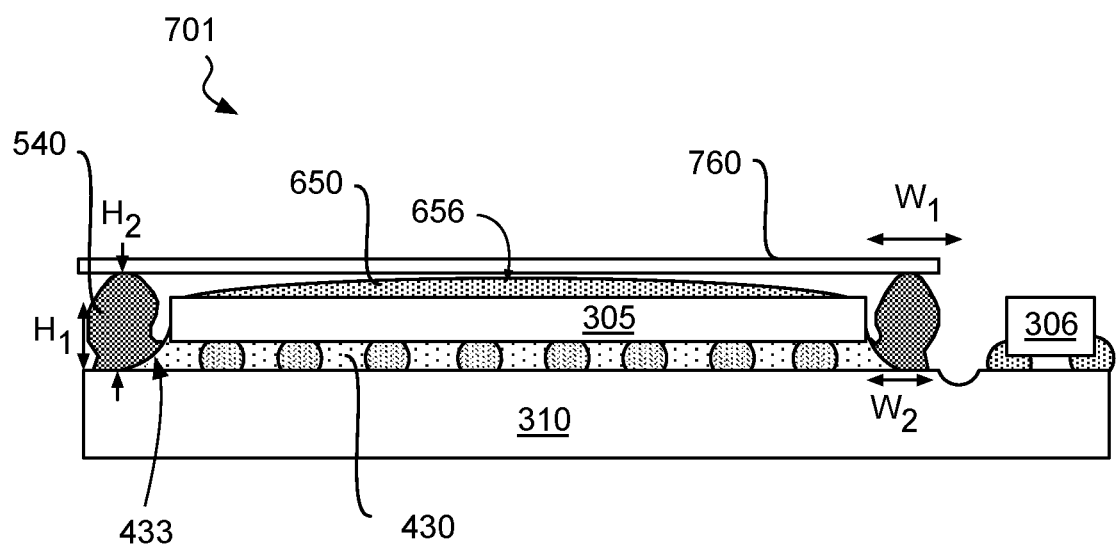
Figure 8:
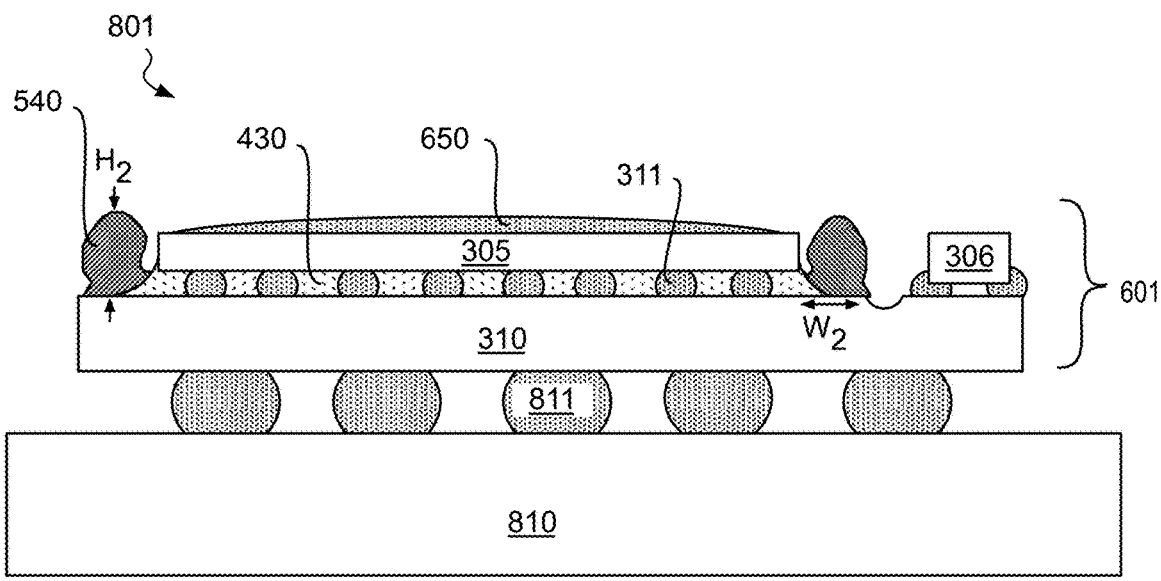
Figure 9:
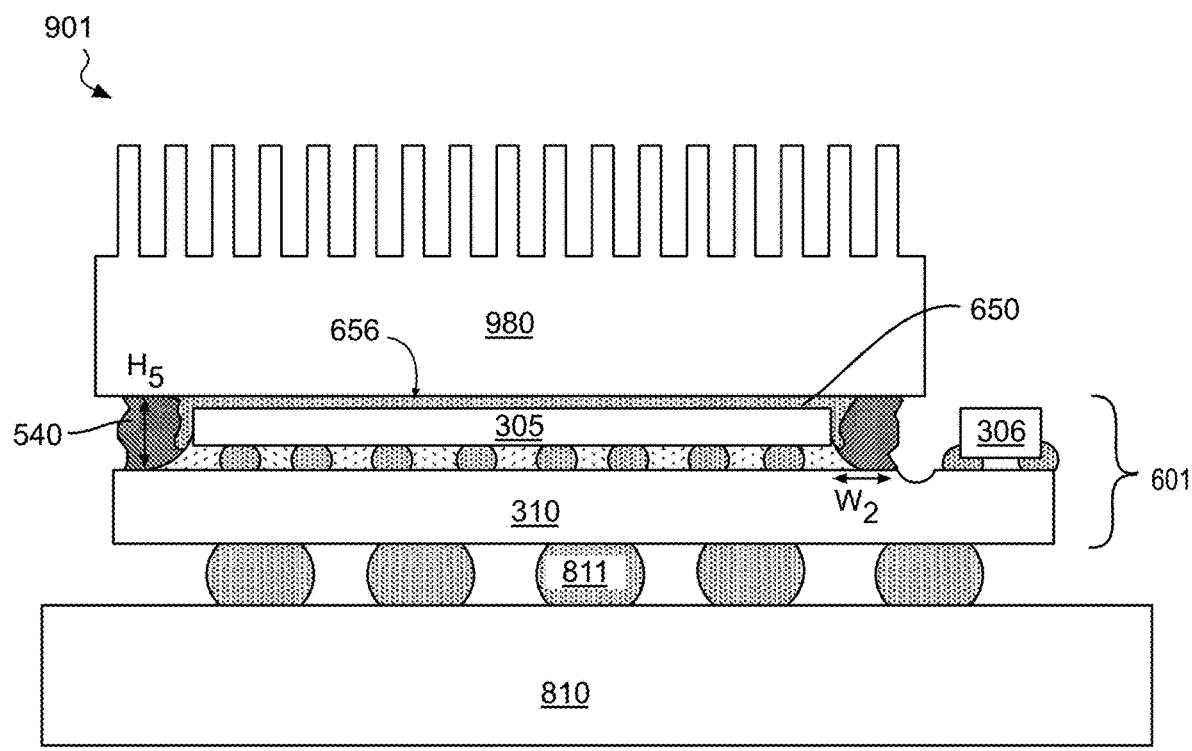

As illustrated in FIG. 8, TIM 650 is exposed, either as received (from block 220, FIG. 2), or following removal of wrap film 760 (FIG. 7). Removal of a wrap film may be before or after a reflow of 2LI 811. FIG. 9 further illustrates the application of a heat sink 980 directly upon TIM surface 656 to form component assembly 901 that may part of any type of electronic system, such as, but not limited to, a mobile handset, a desktop computer, a laptop computer, or server system. Heat sink 980 is an example of finned system-level thermal solution. In other embodiments, cold plate (lacking fins) is placed in contact with TIM 650 substantially as illustrated for heat sink 980. More elaborate thermal solutions may also be employed in place of heat sink 980, such as, but not limited to, a heat pipe.

As shown in FIG. 9, the application of heat sink 980 (or other thermal solution) compresses frame material 540 in the z-dimension, reducing frame material height $H_2$ down to $H_5$, for example in response to an externally applied pressure of a few tens of PSI. The elastic deformation attributable to the low modulus and/or hardness of frame material 540 ensures the formation of a good perimeter seal with heat sink 980. At height $H_5$, contact with TIM 650 provides resistance to further compression of frame material 540, with that contact ensuring good thermal conductivity between TIM 650 and heat sink 980. The compressive force applied through heat sink 980 may induce TIM 650 to laterally spread until further flow is prohibited by frame material 540, in some embodiments, assembly 901 may be heated while compressive force is applied through heat sink 980. One or more mechanical means (not depicted) may be employed to maintain a compressive force between heat sink 980 and IC die 305. Alternatively, there may be an adhesive bond between heat sink 980 and frame material 540. For example, a perimeter portion of heat sink 980 may have adhesive (not depicted) suitable for forming a bond with frame material 540. Alternatively, adhesive may be applied to frame material 540.

As noted above, methods 200 (FIG. 2) are applicable to a wide variety of IC die assemblies beyond the bare IC assembly illustrated in FIG. 3-9. FIG. 10-13, for example, illustrate another IC assembly evolving as the methods of FIG. 2 are practiced in accordance with some alternative embodiments. Reference numbers previously introduced in the context of FIG. 3-9 are retained in FIG. 10-13 for features that share one or more of the attributes previously described.

Figure 10:
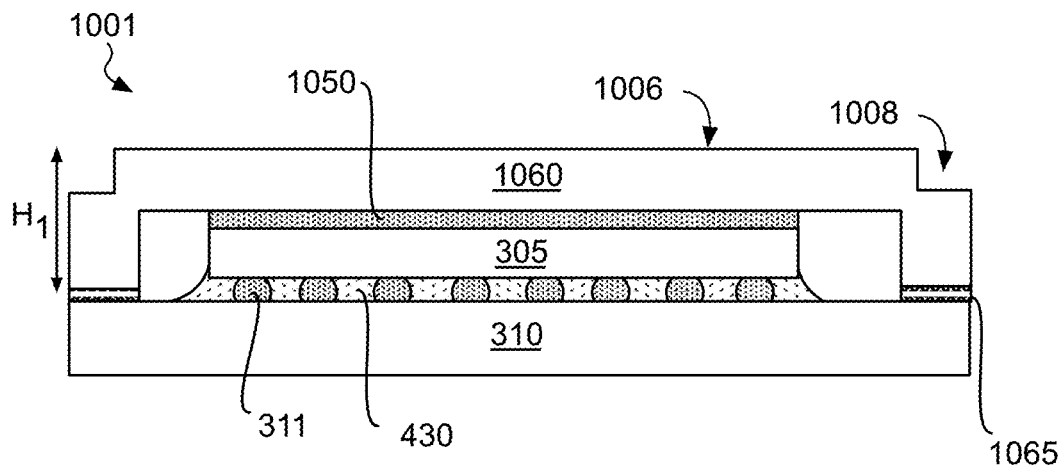
FIGS. 10, 11, 12, and 13 illustrate an IC assembly including a frame material evolving as the methods of FIG. 2 are practiced, in accordance with some alternative embodiments.

FIG. 10 illustrates a cross-sectional view of an IC assembly 1001, which may be received as an input to an assembly process, for example from a IC die vendor. IC assembly 1001 includes IC die 305 attached to assembly substrate 310 through FLI 311. Underfill material 430 again surrounds FLI 311, between IC die 305 and assembly substrate 310. IC assembly 1001 further includes an integrated heat spreader (IHS) 1060, which is physically (and thermally) coupled to a surface of IC die 305 through an intervening thermal interface material 1050. IHS 1060 may be affixed to assembly substrate 310 along a perimeter of IC die 305, for example with any suitable adhesive 1065. IHS 1060 is a lid or cap completely covering IC die 305. IHS 1060 has a footprint larger than IC die 305 (to serve a heat spreading function), and may have any composition and/or architecture offering high thermal conductivity. A heat spreader may include a bulk material such as copper, aluminum or stainless steel. A heat spreader may also have a finish material over the bulk material. In one example, the bulk material comprises at least Cu, and may advantageously be an alloy thereof (e.g., that is predominantly Cu). The finish material may comprise one or more thermally conductive materials suitable for passivating the bulk material, such as a metal (elemental or alloy) that resists oxidation. Where the bulk material comprises Cu, for example, the finish material comprises other than Cu. In some examples, the surface finish material comprises Ni, and may be predominantly Ni. The finish material may have a thickness of a few microns. A heat spreader may also comprise a composite material (e.g., metal matrix composites (MMCs) copper-tungsten, silicon carbide in aluminum matrix, diamond in copper-silver alloy matrix beryllium oxide in beryllium matrix), and/or a graphitic material (e.g., graphite in matrix material). As shown, an upper IHS surface 1006 has a height $H_1$ over assembly substrate 310. At a perimeter portion of IHS 1060, which is well beyond the perimeter edge of IC die 305, there is a recess or notch 1008, which may have any dimensions suitable for functioning as a seat for a frame material.

Figure 11:
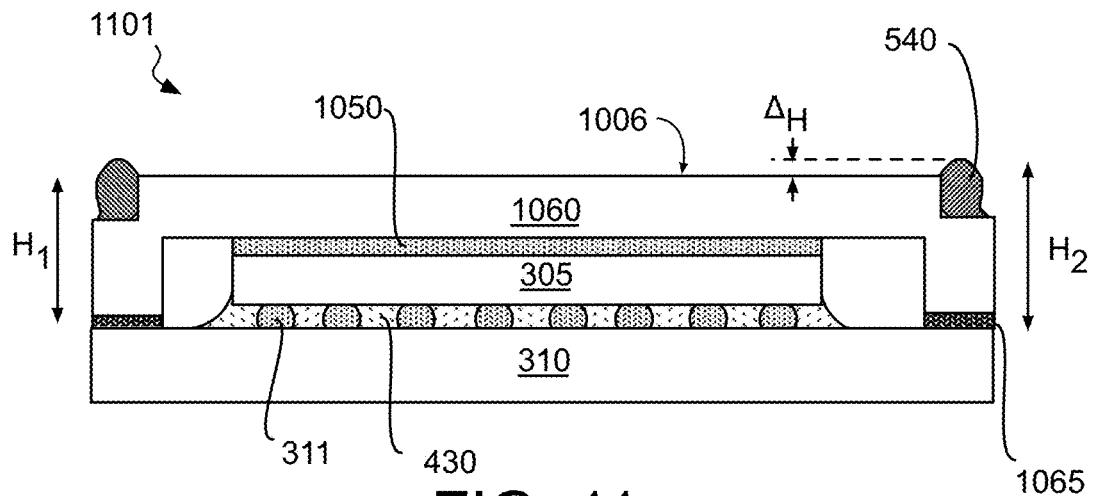
Figure 12:
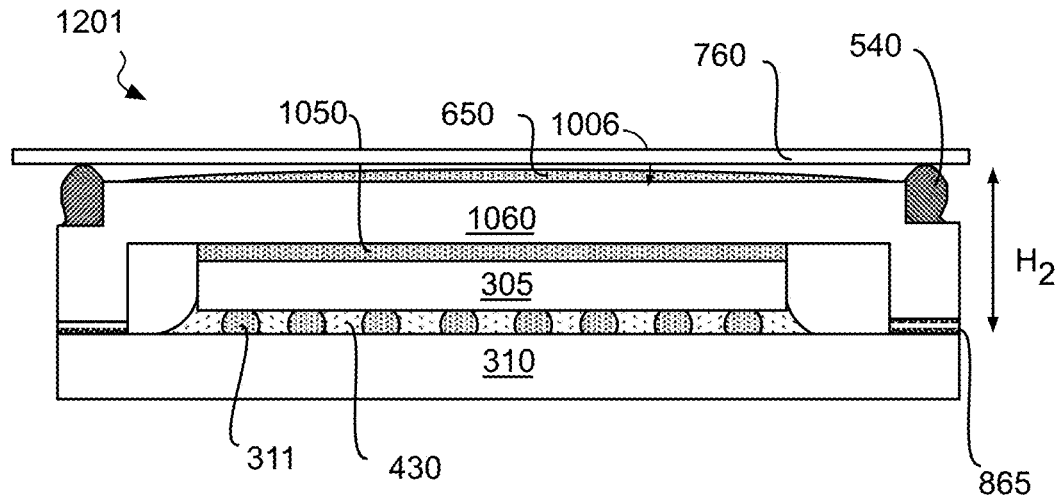
Figure 13:
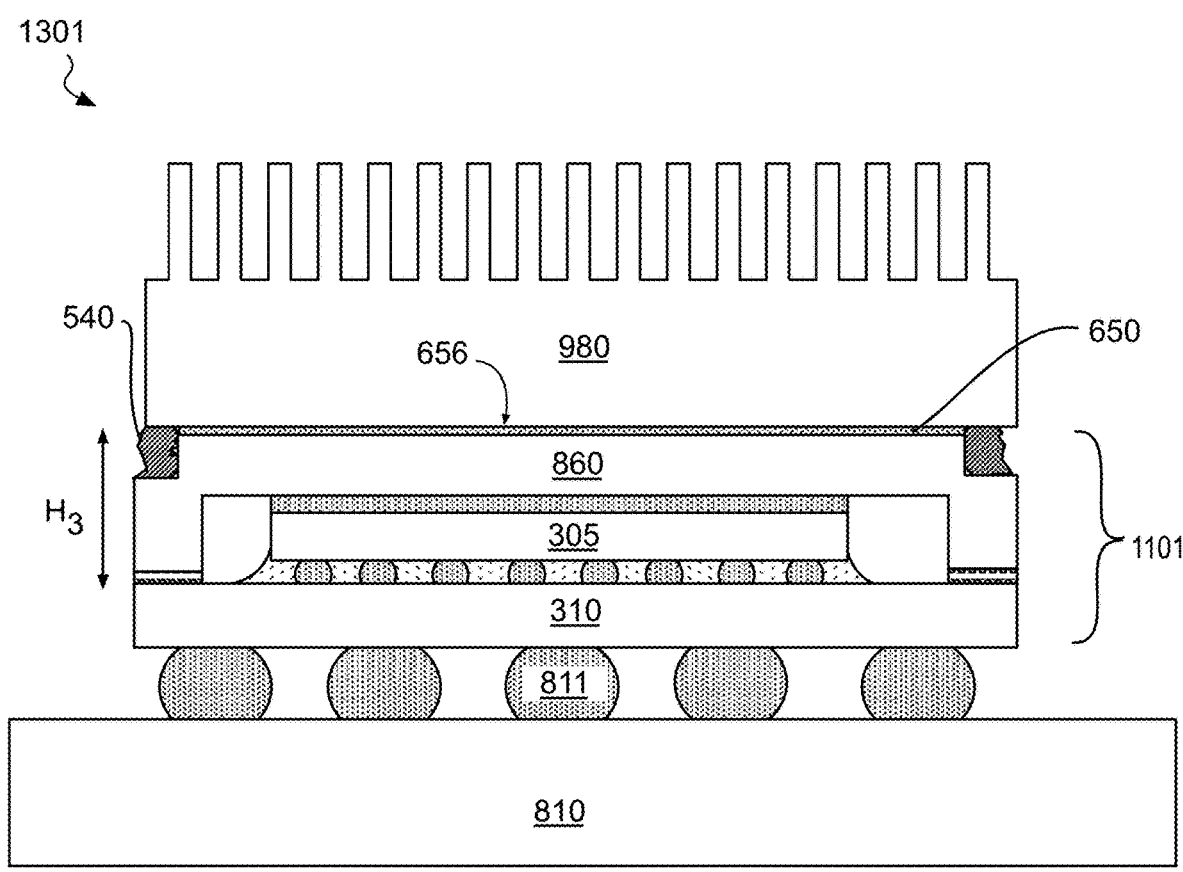

FIG. 11 illustrates an IC assembly 1101 that further includes frame material 540 on the perimeter portion of IHS 1060. In this example, frame material 540 is seated into notch 1008 with a resulting frame material height $H_2$ exceeding height $H_1$ by an amount $\Delta H$ over upper IHS surface 1006. As further shown in FIG. 12, TIM material 650 is applied onto upper IHS surface 1006, and wrap film 760 is affixed to at least frame material 540. IC assembly 1201 may be provided to customer for further assembly with a thermal solution. For example, as shown in FIG. 13, IC assembly 1301 includes heat sink 980, which is in direct contact with TIM surface 656, and in direct contact with frame material 540.

Figure 14:
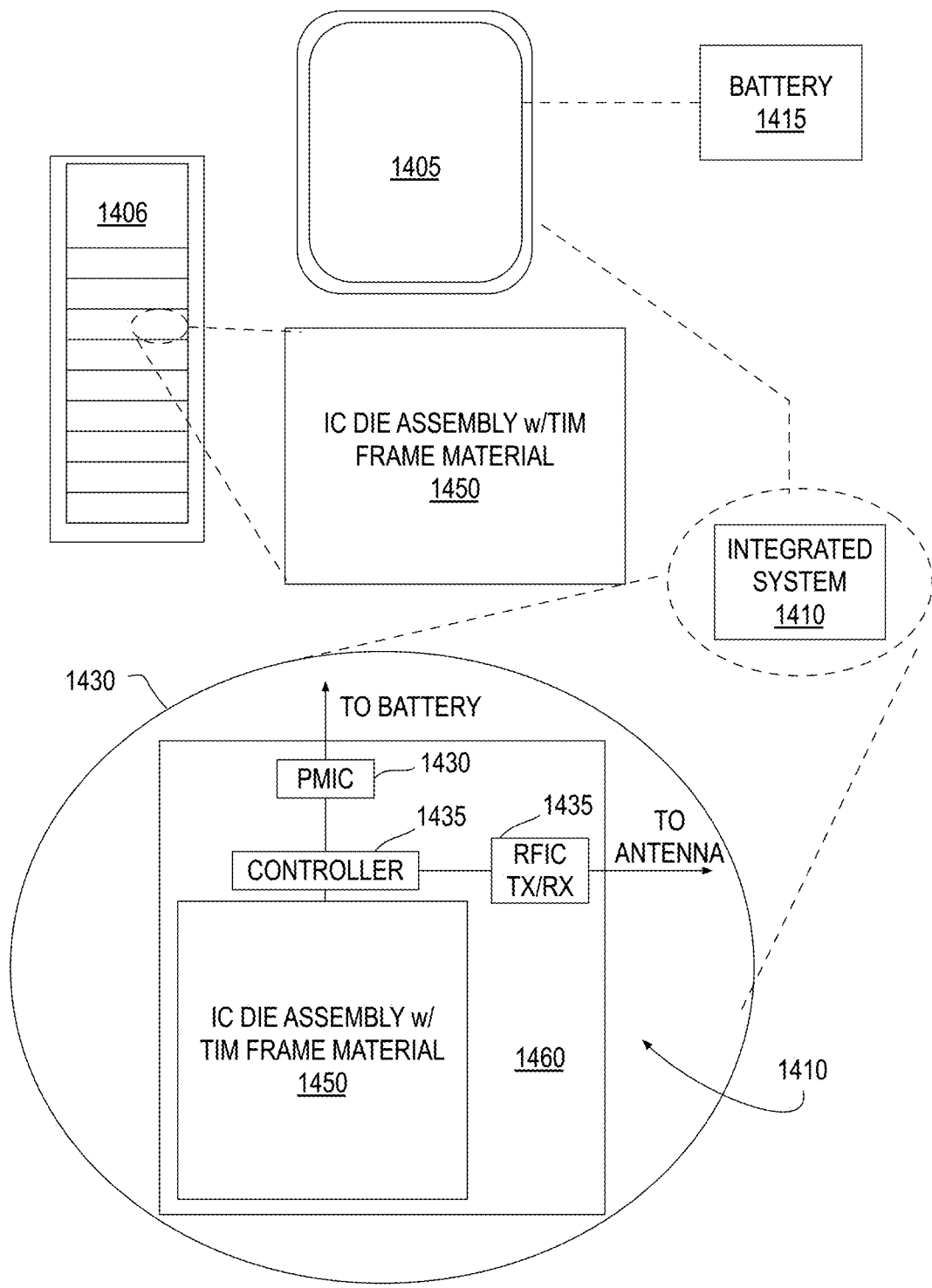
FIG. 14 illustrates a system employing an IC assembly including a thermal interface material frame suitable for containing thermal interface materials, in accordance with some embodiments.

FIG. 14 illustrates some exemplary systems employing an IC assembly including a die perimeter barrier suitable for containing thermal interface materials, in accordance with some embodiments. The system may be a mobile computing platform 1405 and/or a data server machine 1406, for example. Either may employ a component assembly including at least one IC assembly that includes a frame material surrounding a TIM that is in contact with a system-level thermal solution, for example as described elsewhere herein. The server machine 1406 may be any commercial server, for example including any number of high-performance computing platforms disposed within a rack and networked together for electronic data processing, which in the exemplary embodiment includes an IC assembly 1450 with a TIM frame material, for example as described elsewhere herein. The mobile computing platform 1405 may be any portable device configured for each of electronic data display, electronic data processing, wireless electronic data transmission, or the like. For example, the mobile computing platform 1405 may be any of a tablet, a smart phone, laptop computer, etc., and may include a display screen (e.g., a capacitive, inductive, resistive, or optical touchscreen), a chip-level integrated system 1410, and a battery 1415.

Whether disposed within the integrated system 1410 illustrated in the expanded view 1420, or as a stand-alone IC assembly within the server machine 1406, the IC die may be a memory chip (e.g., RAM), or a processor chip (e.g., a microprocessor, a multi-core microprocessor, graphics processor, or the like), for example. The IC die may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 15:
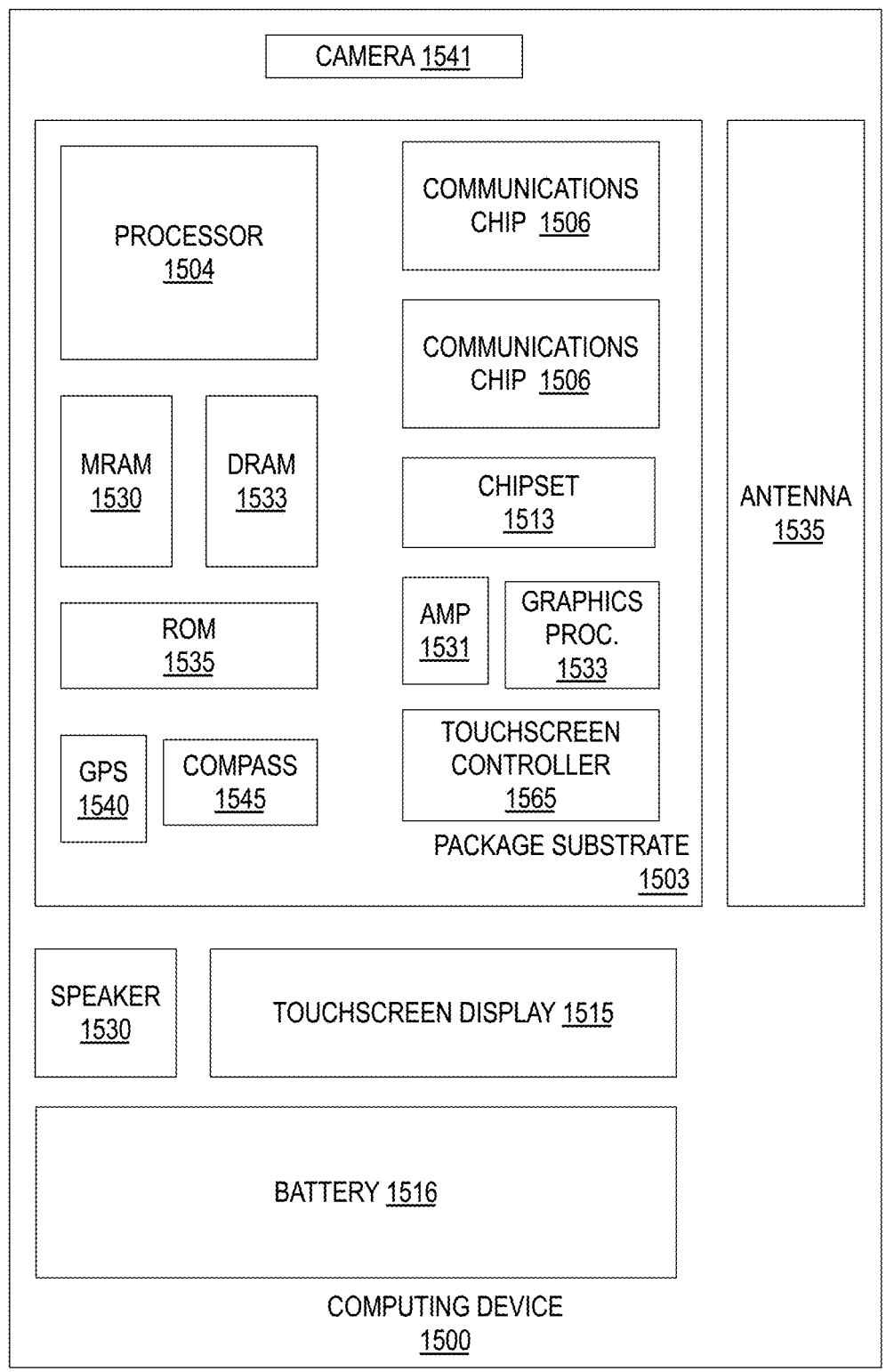
FIG. 15 is a functional block diagram illustrating an electronic computing device, in accordance with an embodiment of the present invention.

FIG. 15 is a functional block diagram of an electronic computing device 1500, in accordance with some embodiments. Device 1500 further includes a motherboard 1502 hosting a number of components, such as, but not limited to, a processor 1504 (e.g., an applications processor). Processor 1504 may be physically and/or electrically coupled to motherboard 1502. In some examples, processor 1504 is within an IC assembly that includes a TIM frame material, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1506 may also be physically and/or electrically coupled to the motherboard 1502. In further implementations, communication chips 1506 may be part of processor 1504. Depending on its applications, computing device 1500 may include other components that may or may not be physically and electrically coupled to motherboard 1502. These other components include, but are not limited to, volatile memory (e.g., DRAM 1532), non-volatile memory (e.g., ROM 1535), flash memory (e.g., NAND or NOR), magnetic memory (MRAM 1530), a graphics processor 1522, a digital signal processor, a crypto processor, a chipset 1512, an antenna 1525, touchscreen display 1515, touchscreen controller 1565, battery 1516, audio codec, video codec, power amplifier 1521, global positioning system (GPS) device 1540, compass 1545, accelerometer, gyroscope, speaker 1520, camera 1541, and mass storage device (such as hard disk drive, solid-state drive (SSD), compact disk (CD), digital versatile disk (DVD), and so forth, or the like.

Communication chips 1506 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1506 may implement any of a number of wireless standards or protocols, including, but not limited to, those described elsewhere herein. As discussed, computing device 1500 may include a plurality of communication chips 1506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) assembly, comprises an IC die over an assembly substrate, the IC die having a surface at a first height from the assembly substrate. The IC assembly comprises a frame material over the assembly substrate and adjacent to at least a majority of a perimeter edge of the IC die, wherein the frame material is at a second height over the assembly substrate, the second height exceeding the first height, and wherein at least some portion of a transverse cross-sectional profile of the frame material has convex or concave surface curvature.

In second examples, for any of the first examples the frame material has an outer edge, opposite the perimeter edge of the IC die, that is no more than 2 mm from the perimeter edge of the IC die.

In third examples, for any of the second examples the second height is no more than 250 μm greater than the first height.

In fourth examples, for any of the first through third examples the assembly further comprises an underfill material between the IC die and the assembly substrate, wherein the frame material is over at least a portion of a fillet of the underfill material, and wherein a fillet of the fame material has the concave surface curvature.

In fifth examples, for any of the first through fourth examples the frame material has a different composition than the underfill material.

In sixth examples, for any of the first through fifth examples the frame material has a hardness less than 70 Shore A.

In seventh examples, for any of the sixth examples the frame material has a hardness between 10 Shore 00 and 60 Shore A.

In eighth examples, for any of the sixth examples the frame material comprises a polysiloxane, a polyurethane, or a polyacrylate.

In ninth examples, for any of the sixth examples the frame material comprises a closed cell foam.

In tenth examples, for any of the first through the ninth examples the frame material comprises two or more material layers, and at least some portion of a transverse cross-sectional profile of each of the material layers has convex or concave surface curvature.

In eleventh examples, for any of the first examples the assembly further comprises a thermal interface material over the surface of the IC die, wherein a thickness of the thermal interface material is less than a difference between the first and second heights.

In twelfth examples, for any of the eleventh examples the thermal interface material is in contact with the frame material, and wherein the thermal interface material comprises a phase change material, a polymer, or a metal alloy including gallium.

In thirteenth examples, for any of the eleventh through twelfth examples the assembly further comprises a film wrap in contact with the frame material, wherein the film wrap spans an entire area of the thermal interface material.

In fourteenth examples, for any of the thirteenth examples, the frame material stands the film wrap off from a surface of the thermal interface material.

In fifteenth examples, for any of the first through tenth examples the assembly further comprises a thermal interface material over the surface of the IC die and a heat exchanger over the thermal interface material.

In sixteenth examples, for further comprising a power supply electrically coupled to the IC die.

In seventeenth examples, an integrated circuit (IC) die assembly comprises an IC die over a first portion of an assembly substrate, a heat spreader over the IC die, opposite the assembly substrate, a perimeter portion of the heat spreader extends over a second portion of the assembly substrate beyond an edge of the IC die, and a surface of the heat spreader is at a first height over the assembly substrate. The assembly comprises a thermal interface material between the heat spreader and the IC die, a frame material over the perimeter portion of the heat spreader, wherein the frame material has a second height over the assembly substrate, the second height exceeding the first height.

In eighteenth examples, for any of the seventeenths a profile of a transverse cross-section through the frame material has convex curvature.

In nineteenth examples, for any of the sixteenth through seventeenth examples the second height is no more than 250 μm greater than the first height.

In twentieth examples, a method of manufacturing an integrated circuit (IC) assembly comprises attaching an IC die to an assembly substrate, the IC die having a surface opposite the assembly substrate, and the surface being a first height from the assembly substrate. The method comprises dispensing a bead of frame material over the assembly substrate and adjacent to at least a majority of a perimeter edge of the IC die, wherein a surface of the bead of frame material opposite the assembly substrate is at a second height from the assembly substrate, greater than the first height.

In twenty-first examples, for any of the twentieth examples the method comprises dispensing an underfill material between the IC die and the assembly substrate, curing the underfill material, the curing forming a fillet of the underfill material beyond the perimeter edge of the IC die, the method comprises dispensing the frame material over the assembly substrate further comprises dispensing the frame material on at least a portion of the fillet.

In twenty-second examples, for any of the twenty-first examples the thermal interface material has a thickness that is less than a difference between the first and second heights.

In twenty-third examples, for any of the twenty-first through twenty-second examples the method further comprises applying a wrap film over the frame material, the wrap film spanning the IC die.

In twenty-fourth examples, for any of twenty-first through twenty-third examples a profile of a transverse cross-section through the frame material has convex or concave surface curvature.

In twenty-fifth examples, for any of the twenty-first examples the method further comprises curing the frame material from an as-dispensed state.

In twenty-six examples, for any of the twenty-first examples the bead of frame material is a first bead, and wherein the method further comprises dispensing a second bead of the frame material around the IC die perimeter, and on top of the first bead.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) assembly, comprising:
   an IC die over a substrate and an underfill material between the IC die and the substrate, the IC die having a surface at a first height from the substrate; and
   a frame material over at least a portion of a fillet of the underfill material and adjacent to at least a majority of a perimeter edge of the IC die, wherein the frame material is at a second height over the substrate, the second height exceeding the first height, and wherein at least some portion of a transverse cross-sectional profile of the frame material has convex or concave surface curvature.

2. The IC assembly of claim 1, wherein the frame material has an outer edge, opposite the perimeter edge of the IC die, that is no more than 2 mm from the perimeter edge of the IC die.

3. The IC assembly of claim 2, wherein the second height is no more than 250 μm greater than the first height.

4. The IC assembly of claim 1, wherein a fillet of the frame material has the concave surface curvature.

5. The IC assembly of claim 1, wherein the frame material has a different composition than the underfill material.

6. The IC assembly of claim 1, wherein the frame material has a hardness less than 70 Shore A.

7. The IC assembly of claim 6, wherein the frame material has a hardness between 10 Shore 00 and 60 Shore A.

8. The IC assembly of claim 6, wherein the frame material comprises a polysiloxane, a polyurethane, or a polyacrylate.

9. The IC assembly of claim 6, wherein the frame material comprises a closed cell foam.

10. The IC assembly of claim 1, wherein the frame material comprises two or more material layers, and at least some portion of a transverse cross-sectional profile of each of the material layers has convex or concave surface curvature.

11. The IC assembly of claim 1, further comprising a thermal interface material over the surface of the IC die, wherein a thickness of the thermal interface material is less than a difference between the first and second heights.

12. The IC assembly of claim 11, wherein the thermal interface material is in contact with the frame material, and wherein the thermal interface material comprises a phase change material, a polymer, or a metal alloy including gallium.

13. The IC assembly of claim 11, further comprising a film wrap in contact with the frame material, wherein the film wrap spans an entire area of the thermal interface material.

14. The IC assembly of claim 13, wherein the frame material stands the film wrap off from a surface of the thermal interface material.

15. The IC assembly of claim 1, further comprising:
   a thermal interface material over the surface of the IC die; and
   a heat exchanger over the thermal interface material.

16. The IC assembly of claim 15, further comprising a power supply electrically coupled to the IC die.

17. An integrated circuit (IC) die assembly, comprising:
   an IC die over a first portion of a substrate;
   a heat spreader over the IC die, opposite the substrate, wherein a perimeter portion of the heat spreader extends over a second portion of the substrate beyond an edge of the IC die, and wherein a surface of the heat spreader is at a first height over the substrate;

a thermal interface material between the heat spreader and the IC die; and a frame material seated into a notch within the perimeter portion of the heat spreader, wherein the frame material has a second height over the substrate, the second height exceeding the first height.

18. The IC assembly of claim 17, wherein the frame material has a hardness between 10 Shore 00 and 60 Shore A.

19. The IC assembly of claim 17, wherein the second height is no more than 250 μm greater than the first height.

20. The IC assembly of claim 17, wherein the frame material comprises a polysiloxane, a polyurethane, or a polyacrylate.

21. The IC assembly of claim 17, wherein a profile of a transverse cross-section through the frame material comprises an inner sidewall proximal the thermal interface material and an outer sidewall, and wherein the outer sidewall comprises a fillet with concave surface curvature.

22. The IC assembly of claim 17, wherein the thermal interface material has a thickness less than a difference between the first and second heights.

* * * * *